United States Patent
Hagino

(10) Patent No.: US 7,276,984 B2
(45) Date of Patent: Oct. 2, 2007

(54) OSCILLATION CIRCUIT CAPABLE OF HAVING STABLE OSCILLATION IN WIDE TEMPERATURE RANGE

(75) Inventor: Kohichi Hagino, Kawanishi (JP)

(73) Assignee: Ricoh Company, Ltd. (JP)

( * ) Notice: Subject to any disclaimer, the term of this patent is extended or adjusted under 35 U.S.C. 154(b) by 6 days.

(21) Appl. No.: 11/288,271

(22) Filed: Nov. 29, 2005

(65) Prior Publication Data

US 2006/0119447 A1    Jun. 8, 2006

(30) Foreign Application Priority Data

Dec. 3, 2004    (JP) ............... 2004-350626

(51) Int. Cl.
*H03B 5/32* (2006.01)
(52) U.S. Cl. ............... 331/160; 331/116 FE; 331/176; 331/185; 331/186; 327/535; 327/545
(58) Field of Classification Search ........... 331/160, 331/185, 186, 116 FE, 176; 327/535, 545
See application file for complete search history.

(56) References Cited

U.S. PATENT DOCUMENTS 7,042,299 B2 * 5/2006 Tachibana et al. .......... 331/158
7,088,196 B2 * 8/2006 Ashida et al. ............... 331/158

FOREIGN PATENT DOCUMENTS

JP    2003-283249    10/2003

* cited by examiner

*Primary Examiner*—Benny T. Lee
*Assistant Examiner*—Levi Gannon
(74) *Attorney, Agent, or Firm*—Dickstein Shapiro LLP

(57) ABSTRACT

An oscillation circuit includes a constant current source, a current mirror circuit configured to receive a constant input current from the constant current source and to output a current proportional to the constant input current, a first inverter configured to be driven with a quartz resonator to oscillate, an operational amplifier configured to supply power to the first inverter with a voltage equal to an input voltage of the operational amplifier and a second inverter having a power supply terminal connected to the current mirror circuit and to the operational amplifier and configure to generate the input voltage for the operational amplifier.

4 Claims, 2 Drawing Sheets

US 7,276,984 B2

OSCILLATION CIRCUIT CAPABLE OF HAVING STABLE OSCILLATION IN WIDE TEMPERATURE RANGE

This patent application claims priority to Japanese patent application, No. 2004-350626 filed on Dec. 3, 2004 in the Japan Patent Office, the entire contents of which are incorporated by reference herein.

FIELD OF THE INVENTION

The present invention relates to an oscillation circuit capable of having a stable oscillation in a wide temperature range.

BACKGROUND OF THE INVENTION

Electronic circuit systems, particularly a portable system such as, for example, a wristwatch, a portable phone, and the like, widely use a crystal oscillator to generate a basic clock signal. Such a portable system is generally used under a considerably extended range of environmental conditions such as temperature in particular. Therefore, the crystal oscillator used in the portable systems is requested to operate stably in a wide temperature range.

FIG. 1 illustrates a conventional crystal-oscillator circuit. The conventional crystal-oscillator circuit includes an inverter INV1, a resistor R1, a quartz resonator XL, two capacitors C1 and C2, and a constant voltage power supplier 50. The inverter INV1 includes MOSFET (metal oxide semiconductor field effect transistor) transistors and receives a constant power supply voltage from the constant voltage power supplier 50. The MOSFET transistors of the inverter INV1 have a transfer conductance gm which needs to be constant for a stable oscillation in this crystal-oscillator circuit. However, characteristics of MOSFET transistors change in response to variations of an environmental temperature, resulting in a change of the transfer conductance gm.

When the transfer conductance gm decreases and, as a result, a loop gain of the crystal-oscillator circuit becomes below "1", the crystal-oscillator circuit ceases to oscillate because the circuit condition is out of range for the oscillation. Meanwhile, if the transfer conductance gm increases, the circuit may perform an abnormal oscillation. Thus, there is an increasing demand to obtain an oscillation circuit which maintains a stable oscillation in a wide temperature range.

BRIEF SUMMARY OF THE INVENTION

The present invention provides a novel oscillation circuit which includes a constant current source, a current mirror circuit configured to receive a constant input current from the constant current source and to output a current proportional to the constant input current, a first inverter configured to be driven with a quartz resonator to oscillate, an operational amplifier configured to supply power to the first inverter with a voltage equal to an input voltage of the operational amplifier and a second inverter having a power supply terminal connected to the current mirror circuit and to the operational amplifier and configured to generate the input voltage for the operational amplifier.

The present invention further provides a novel feature of an oscillation circuit where the voltage of the power supplied from the operational amplifier to the first inverter changes in accordance with temperature.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
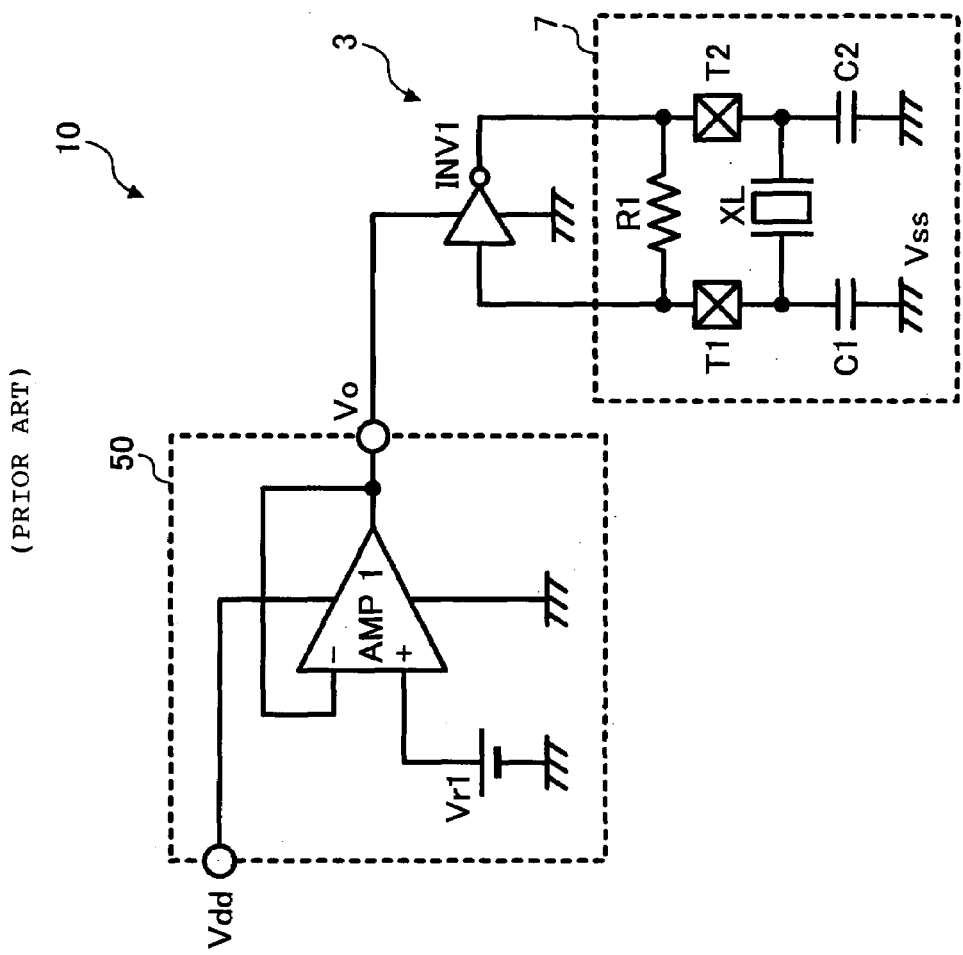
FIG. 1 is a circuit diagram of a conventional crystal-oscillator circuit.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 2, an oscillation circuit 1 according to an example embodiment is described.

Figure 3:
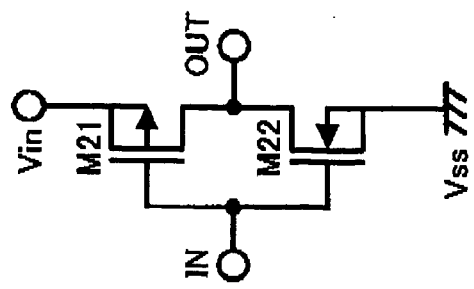
FIG. 3 illustrates an inverter circuit used in the oscillation circuit shown in FIG. 2.
Figure 2:
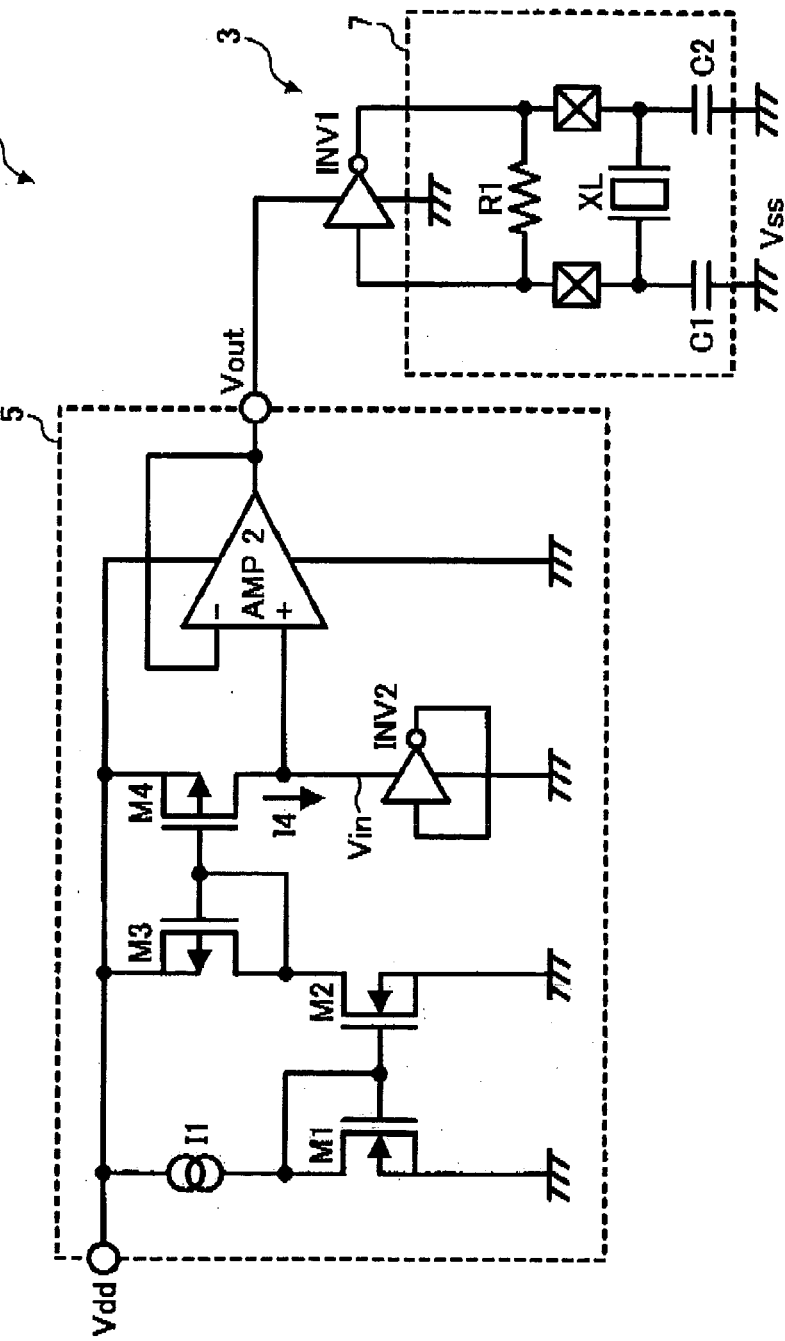
FIG. 2 is a circuit diagram of an oscillation circuit according to an exemplary embodiment.

FIG. 2 illustrates a circuit diagram of the oscillation circuit 1 according to an exemplary embodiment. FIG. 3 illustrates an inverter circuit used in the oscillation circuit 1 shown in FIG. 2. The oscillation circuit 1 includes a crystal-oscillator 3 and a power supply circuit 5. The crystal-oscillator 3 includes a first inverter INV1 and a feedback circuit 7. The feedback circuit 7 includes a resistor R1, a quartz resonator XL and capacitors C1 and C2.

The power supply circuit 5 supplies power to the crystal-oscillator 3 from an output terminal. The resistor R1 is connected between input and output terminals of the first inverter INV1 so that the first inverter INV1 functions as an analog amplifier. The quartz resonator XL is also connected between the input and output terminals of the first inverter INV1 so that the first inverter INV1 oscillates at an eigen-frequency. The capacitor C1 is connected between the input terminal of the first inverter INV1 and a negative power source Vss. The capacitor C2 is connected between the output terminal of the first inverter INV1 and the negative power source Vss.

The power supply circuit 5 includes a current source I1, four MOSFET (metal oxide semiconductor field-effect transistor) transistors M1-M4, a second inverter INV2, and an operational amplifier AMP 2 (differential amplifier). The second inverter INV2 has a similar circuit configuration to the first inverter INV1 shown in FIG. 3 and includes a P-channel MOSFET transistor M21 and an N-channel MOSFET transistor M22.

The MOSFET transistors M1 and M2 are N-channel MOSFET transistors and the MOSFET transistors M3 and M4 are P-channel MOSFET transistors. The MOSFET transistors M1 and M2 form a current mirror circuit by connections of their gates to each other and their sources to the negative power source Vss. The gate of the MOSFET transistor M1 is connected to a drain of the MOSFET transistor M1. The drain of the MOSFET transistor M1 is connected to a positive power source Vdd through the current source I1 so that a drain current of the MOSFET transistor M2 is proportional to the current of the current source I1.

The MOSFET transistors M3 and M4 also form a current mirror circuit by connections of their gates to each other and their sources to the positive power source Vdd. The drain of the MOSFET transistor M3 is connected to the drain of the MOSFET transistor M2 so that the drain current of the MOSFET transistor M3 is equal to the drain current of the MOSFET transistor M2. Additionally, the gate of the MOSFET transistor M3 is connected to the drain of the MOSFET transistor M3 so that the current mirror circuit outputs a drain current I4 of the MOSFET transistor M4 proportional to the current of the current source I1.

The MOSFET transistor M4 has a drain connected to a power supply terminal of the second inverter INV2 which has input and output terminals shorted. A voltage applied through the drain of the MOSFET transistor M4 to the power supply terminal of the second inverter INV2 is referred to as a power supply voltage Vin. With this configuration, a constant current which is a drain current of MOSFET transistor M4 flows to the power supply terminal of the second inverter INV2. As a result, the MOSFET transistor M21 and the MOSFET transistor M22 of the second inverter INV2 are driven into a saturation region of the MOS characteristics.

A transfer conductance gm of the MOSFET transistor in the saturation region is generally defined as a function of drain current Id and satisfies a formula 1:

$$gm = \sqrt{(2k \ast Id)},$$

in which k is determined by a manufacturing process and a transistor size.

When the current generated by the current source I1 is constant over varying temperature, the transfer conductance gm has an approximately constant value over varying temperature.

The transfer conductance gm of MOSFET transistor in the saturation region can also be defined by a potential difference between a gate-source voltage Vg and a threshold voltage Vt of the MOSFET transistor. More specifically, each of the MOSFET transistors M21 and M22 has the transfer conductance gm defined by a potential difference between the gate-source voltage vg and the threshold voltage Vt thereof. The transfer conductance gm generally satisfies a formula 2:

$$gm = k(Vg - Vt),$$

in which Vg is the gate-source voltage of the MOSFET transistors M21 and M22 and Vt is the threshold voltage of the MOSFET transistors M21 and M22.

The power supply voltage Vin of the second inverter INV2 is a sum of the gate-source voltages of the P-channel MOSFET transistor and N-channel MOSFET transistor. The Vt has a temperature dependence. Based on the formula 2, the potential difference Vg of the gate-source of the MOSFET transistor has a temperature dependence because the transfer conductance gm is constant in this exemplary embodiment. The power supply voltage Vin of the second inverter INV2 changes in accordance with a change of a temperature.

In this embodiment, the power supply voltage Vin of the second inverter INV2 is fed to a non-inverting input terminal of the operational amplifier AMP2. The operational amplifier AMP2 is configured to operate as a voltage follower circuit since its output terminal is connected to an inverting input terminal thereof. The output voltage Vout is the power supply voltage for the inverter INV1 of the crystal-oscillator 3. Therefore, the same voltage as the power supply voltage Vin of the second inverter INV2 is fed to a power supply terminal of the inverter INV1 of the crystal-oscillator 3.

Moreover, the MOSFET transistors M21 and M22 which form the second inverter circuit INV2 is designed to have a constant transfer conductance gm against variations of temperature. Additionally, the first and second inverter circuits INV1 and INV2 have a common configuration so as to have approximately equivalent electrical and temperature characteristics.

The power supply voltage Vout of the first inverter INV1 is equal to the power supply voltage Vin of the second inverter INV2 so that the transfer conductance gm of the first inverter circuit INV1 is equal to the transfer conductance of the second inverter circuit INV2. As a result, the transfer conductance gm of the first inverter is kept constant with regard to temperature. Consequently, the oscillation circuit 1 maintains a stable oscillation with a continuous oscillation and no abnormal oscillation in a wide temperature range.

Numerous additional modifications and variations are possible in light of the above teachings. It is therefore to be understood that within the scope of the appended claims, the disclosure of this patent specification may be practiced otherwise than as specifically described herein.

What is claimed is:

1. An oscillation circuit comprising;
  a constant current source;
  a current mirror circuit configured to receive a constant input current from the constant current source and to output a current proportional to the constant input current;
  a first inverter configured to be driven with a quartz resonator to oscillate;
  an operational amplifier configured to supply power to the first inverter with a voltage equal to an input voltage of the operational amplifier; and
  a second inverter having a power supply terminal connected to the current mirror circuit and to the operational amplifier and configure to generate the input voltage for the operational amplifier.

2. The oscillation circuit according to claim 1, wherein the second inverter has an input and an output terminal connected to each other.

3. The oscillation circuit according to claim 1, wherein the voltage of the power supplied from the operational amplifier to the first inverter changes in accordance with temperature.

4. The oscillation circuit according to claim 1, wherein:
  the second inverter comprises an N-channel MOSFET transistor and a P-channel MOSFET transistor; and
  the second inverter has electrical characteristics and temperature dependence substantially equivalent to electrical characteristics and temperature dependence of the first inverter.

* * * * *